United States Patent
Loldj et al.

(10) Patent No.: US 9,080,576 B2
(45) Date of Patent: Jul. 14, 2015

(54) METHOD AND APPARATUS FOR CONTROLLING A PROCESSING SYSTEM

(75) Inventors: Youssef Loldj, Sunnyvale, CA (US); Jay J. Jung, Sunnyvale, CA (US); Mehran Moalem, Cupertino, CA (US); Paul E. Fisher, Los Altos, CA (US); Joshua Putz, Fairfield, CA (US); Andreas Neuber, Stuttgart (DE)

(73) Assignee: APPLIED MATERIALS, INC., Santa Clara, CA (US)

(*) Notice: Subject to any disclaimer, the term of this patent is extended or adjusted under 35 U.S.C. 154(b) by 452 days.

(21) Appl. No.: 13/359,899

(22) Filed: Jan. 27, 2012

(65) Prior Publication Data

US 2012/0204965 A1    Aug. 16, 2012

Related U.S. Application Data

(60) Provisional application No. 61/442,277, filed on Feb. 13, 2011.

(51) Int. Cl.
*F04B 49/06* (2006.01)
*F04D 27/00* (2006.01)
*F04D 19/04* (2006.01)
*F17D 3/00* (2006.01)

(52) U.S. Cl.
CPC .............. *F04D 27/004* (2013.01); *F04D 19/04* (2013.01); *F17D 3/00* (2013.01)

(58) Field of Classification Search
CPC .......... F04B 37/14; F04B 37/16; F04B 49/00; F04B 39/20; F04C 25/02; F04C 2220/10; F04C 2220/12; F04C 2270/18; F04C 2270/185; F04C 14/08; F04C 28/08; F04D 17/168; F04D 19/04; F04D 19/042; F04D 15/0066; F04D 27/004
USPC ................................................ 417/44.2, 44.3
See application file for complete search history.

(56) References Cited

U.S. PATENT DOCUMENTS

| | | | |
|---|---|---|---|
| 8,197,233 B2* | 6/2012 | Fleming | 417/473 |
| 8,444,392 B2* | 5/2013 | Turner et al. | 417/44.3 |
| 2003/0123990 A1 | 7/2003 | Yamamoto et al. | |
| 2004/0013531 A1* | 1/2004 | Curry et al. | 417/42 |
| 2005/0025640 A1* | 2/2005 | Sekiguchi et al. | 417/423.4 |
| 2005/0031468 A1* | 2/2005 | Kawaguchi et al. | 417/410.1 |
| 2007/0048145 A1 | 3/2007 | Ishii et al. | |
| 2007/0260343 A1* | 11/2007 | Raoux et al. | 700/95 |
| 2011/0082580 A1 | 4/2011 | Philippe et al. | |
| 2011/0200450 A1* | 8/2011 | Shelley et al. | 417/1 |

OTHER PUBLICATIONS

International Search Report and Written Opinion mailed Aug. 9, 2011 for PCT Application No. PCT/US2012/023950.

* cited by examiner

*Primary Examiner* — Peter J Bertheaud
*Assistant Examiner* — Dnyanesh Kasture
(74) *Attorney, Agent, or Firm* — Moser Taboada; Alan Taboada

(57) ABSTRACT

Methods and apparatus for controlling a processing system are provided herein. In some embodiments, a method of controlling a processing system may include operating a vacuum pump coupled to a process chamber at a first baseline pump idle speed selected to maintain the process chamber at a pressure equal to a first baseline pump idle pressure; monitoring the pressure in the process chamber while operating the vacuum pump at the first baseline pump idle speed; and determining whether the first baseline pump idle pressure can be maintained in the process chamber when the vacuum pump is operating at the first baseline pump idle speed.

16 Claims, 5 Drawing Sheets

METHOD AND APPARATUS FOR CONTROLLING A PROCESSING SYSTEM

CROSS-REFERENCE TO RELATED APPLICATIONS

This application claims benefit of U.S. provisional patent application Ser. No. 61/442,277, filed Feb. 13, 2011, which is herein incorporated by reference.

FIELD

Embodiments of the present invention generally relate to controls systems for vacuum processing equipment used, for example, in the manufacture of electronic devices.

BACKGROUND

Electronics manufacturing facilities must maintain process chambers at appropriate operating pressures to maximize yield, throughput, uniformity, kit life, and up time. Additionally, electronics manufacturing facilities are significantly impacted by unscheduled down time, yield loss, and equipment damage related to line clogging, line leaks, reactive chemical incidents due to line leaks, and pump wear out. In current manufacturing facilities, inspection and maintenance of processing equipment related to the aforementioned problems are performed manually after such a problem occurs.

For example, conventional best-known methods (BKM) for leak checking of lines, line inspection for clogging, and pump capacity testing (running pump capacity curves between and after regularly scheduled preventative maintenance checks) take time, are difficult, require highly skilled labor, and are frequently not employed unless a pattern of significant incidents have occurred.

Solar and light emitting diode (LED) facilities are particularly impacted by these issues because difficulty of existing BKM procedures in finding leaks, defining the line clogging, and or pump wear time line out between normally scheduled replacement or inspection schedules.

Thus, the inventors have provided an improved monitoring and control systems for use in vacuum processing equipment.

SUMMARY

Methods and apparatus for controlling a processing system are provided herein. In some embodiments, a method of controlling a processing system may include operating a vacuum pump coupled to a process chamber at a first baseline pump idle speed selected to maintain the process chamber at a pressure equal to a first baseline pump idle pressure; monitoring the pressure in the process chamber while operating the vacuum pump at the first baseline pump idle speed; and determining whether the first baseline pump idle pressure can be maintained in the process chamber when the vacuum pump is operating at the first baseline pump idle speed.

In some embodiments, the method may include upon monitoring a pressure in the process chamber that is different from the first baseline pump idle pressure, adjusting the pump speed of the vacuum pump to a second pump idle speed to maintain the process chamber at the first baseline pump idle pressure; and determining whether the second pump idle speed is within a predetermined tolerance of the first baseline pump idle speed.

In some embodiments, the method may include idling the vacuum pump when no gases are flowing in the process chamber; and monitoring the pressure in the process chamber while idling the vacuum pump at the first baseline pump idle speed.

In some embodiments, the method may be incorporated into a computer readable medium that, when executed, causes the method of controlling a processing system to be performed.

In some embodiments, a processing system may include a controller having one or more inputs to receive respective input values corresponding to a pressure in an interior volume of a process chamber and a pump speed of a vacuum pump coupled to the process chamber, wherein the controller is configured to receive the respective input values while the process chamber is in an idle mode, and wherein the controller is further configured to determine whether the process chamber can be maintained at a predetermined pressure corresponding to the vacuum pump operating at or within a predetermined tolerance of a baseline pump idle speed.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
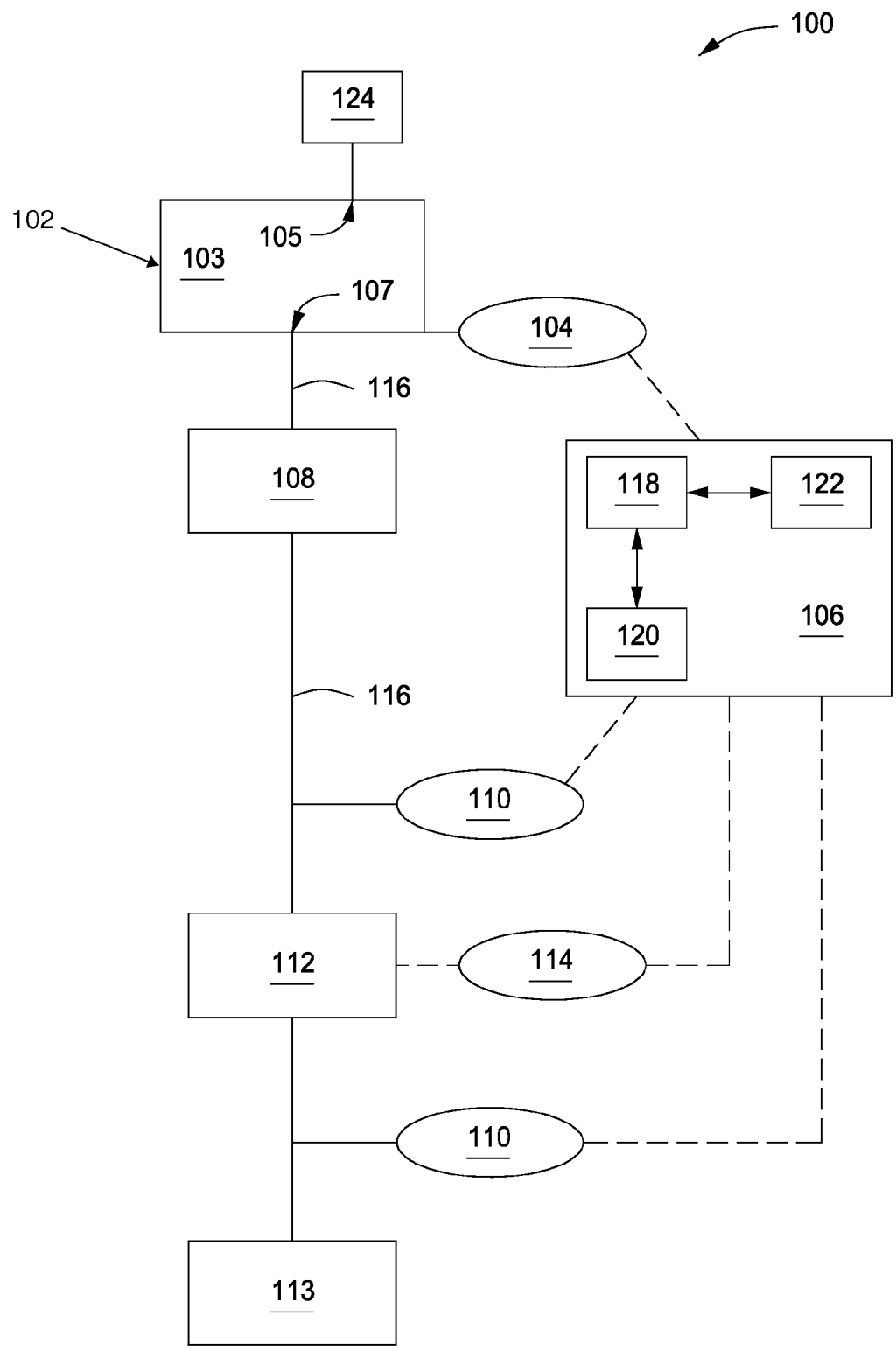
FIG. 1 depicts a schematic view of a processing system having a control system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to controls systems and methods for monitoring and controlling pump systems used in vacuum processing equipment, such as may be used in the manufacture of electronic devices. For example, such control systems and methods may be used advantageously in equipment for manufacturing solar panels, silicon wafers and silicon-based semiconductor devices, liquid crystal displays (LCD), light emitting diodes (LED), and the like.

Embodiments of the present invention may provide an integrated controls solution using the vacuum pressure in the process chamber in a feedback control loop to dynamically change the pump speed (e.g., pump idle speed) of the pump to maintain a chamber pressure baseline (e.g., baseline pump idle pressure) and predict a need for a preventative maintenance (PM) downtime if degradation in the pressure is detected. In some embodiments, the present invention may be utilized while the chamber is in an idle mode, for example, when there are no processes being performed and/or no process gases flowing in the chamber. In the idle mode, the pump speed may be lower than during a production mode of the chamber.

FIG. 1 depicts a schematic view of a processing system 100 having a control system in accordance with some embodiments of the present invention. As shown in FIG. 1, the processing system may generally include a process chamber 102 having an interior processing volume 103 and having one or more gas inlets 105 coupled to one or more gas sources 124 and an outlet 107 coupled to a vacuum pump 112 via an exhaust line 116.

The one or more gas sources 124 may provide one or more gases to the process chamber 102, such as process gases, cleaning gases, purge gases, or the like. The vacuum pump 112 is generally used to remove materials such as unused process gases, process byproducts, and the like from the process chamber. The vacuum pump 112, in combination with a valve 108 disposed in the exhaust line 116 (such as a gate valve, a throttle valve, or the like), can also be used to control the pressure in the process chamber 102. A first pressure sensor 104 (such as a pressure gauge) may be coupled to the process chamber 102 to sense the pressure within the process chamber 102.

A controller 106 may be coupled to receive signals from the first pressure sensor 104 and a second pressure sensor 110 (discussed in more detail below). The controller 106 may be any suitable controller for use in an industrial setting. In some embodiments, the controller 106 may be a sub fab controller that is coupled to and controls various components within a sub fab of the substrate processing system 100. In some embodiments the controller 106 may be a controller coupled to the process chamber 102. Alternatively the controller 106 may be a separate controller configured as described herein.

The controller 106 may comprise a central processing unit (CPU) 118, a memory 120, and support circuits 122 for the CPU. The controller 106 may control each component of the processing system 100 directly, or via computers (or controllers) associated with particular process chamber and/or support system components. The controller 106 may be one of any form of general-purpose computer processor that can be used in an industrial setting for controlling various chambers and sub-processors. The memory, or computer-readable medium of the CPU may be one or more of readily available memory such as random access memory (RAM), read only memory (ROM), floppy disk, hard disk, flash, or any other form of digital storage, local or remote. The support circuits are coupled to the CPU for supporting the processor in a conventional manner. These circuits include cache, power supplies, clock circuits, input/output circuitry and subsystems, and the like. Inventive methods as described herein may be stored in the memory of the controller 106 as software routine that may be executed or invoked to control the operation of the substrate processing system 100 in the manner described herein. For example, each method step may be stored as or in a module of the memory 120. The software routine may also be stored and/or executed by a second CPU (not shown) that is remotely located from the hardware being controlled by the controller 106.

The controller 106 may be coupled to and communicate with the first pressure sensor 104, the second pressure sensor 110, and a pump controller 114. The second pressure sensor 110 may be configured to sense a pressure in the line 116 between the valve 108 and the vacuum pump 112. The second pressure sensor 110 can be located in any position between the valve 108 and the vacuum pump 112, but is typically positioned near the vacuum pump inlet. Alternatively, the second pressure sensor 110 may be disposed between the vacuum pump 112 and an abatement system 113 for abating the process chamber exhaust such that the controller 106 may monitor inlet pressure on the abatement system 113. The pump controller 114 is coupled to and controls the speed of the vacuum pump 112. Pump controller can be a PLC (Programmable logical controller), a Micro controller, or in a case of a stripped down pump, variable frequency drive (VFD) and input/output (IO) modules controlled by the controller 106. For example, the pump controller 114 could be integrated into the vacuum pump package and the set points could be driven from the controller 106, or the pump controller could be a stand-alone unit receiving vacuum pump power, pump speed, inert flow, coolant flow, and operating temperature commands from the controller 106. The pump controller 114 can optionally send signals to valves within the pump package to control the level of inert pump purge, pump rpm, pump power usage, pump coolant, and pump temperature. The control signals from the pump controller 114 may control the total inert gas addition and cooling water flow or optionally control the cooling water and inert gas addition by compression zone.

In operation, the controller 106 may dynamically control an idle speed setpoint of the pump speed of the vacuum pump 112 based on feedback from the pressure sensor 104. In addition the controller 106 may detect degradation or leaks in the exhaust line 116 of the process chamber 102. For example, in some embodiments, the controller 106 may receive a signal from the pressure sensor 104 correlating to the vacuum pressure in the process chamber 102 and may use that signal in a feedback control loop to dynamically change the pump speed (e.g., a pump idle speed) of the vacuum pump 112 to maintain a chamber pressure baseline (e.g., a baseline pump idle pressure) and to predict a need for a preventative maintenance downtime if degradation in the chamber pressure is detected.

Figure 2:
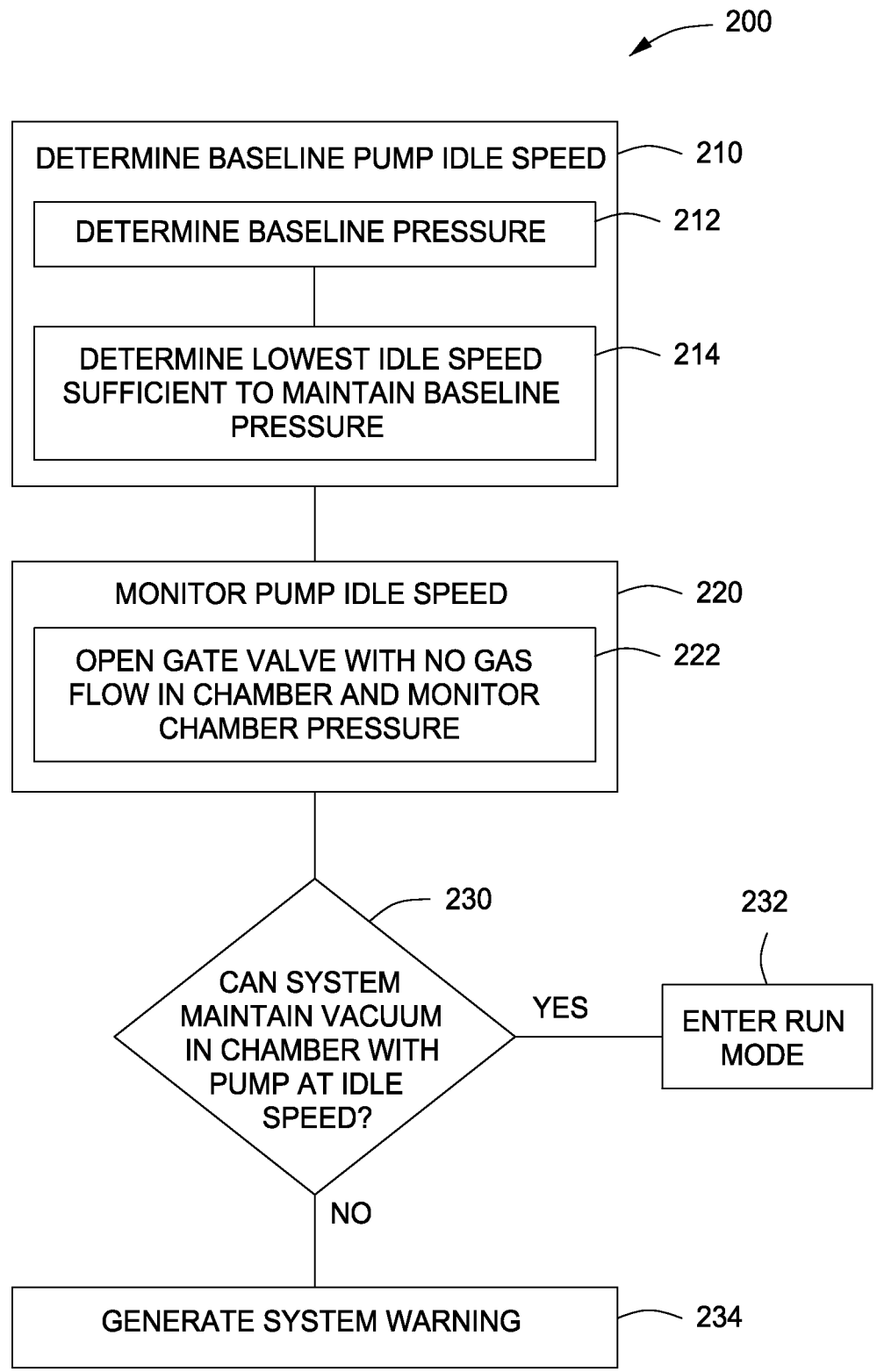
FIG. 2 depicts a flow chart of a method 200 for controlling a processing system in accordance with some embodiments of the present invention.

FIG. 2 depicts a flow chart of a method 200 for controlling a processing system in accordance with some embodiments of the present invention. In some embodiments, the method 200 may be an example of a module of the memory 122 of the controller and may be used to control the processing system as described herein. The method 200 generally begins at 210 where a baseline pump idle speed is determined. For example, a baseline pump idle speed determiner module may be included the memory 122 of the controller and/or the memory of another controller, such as the pump controller 114 for determining the base pump idle speed. In some embodiments, the baseline pump idle speed may be determined by first determining a baseline pump idle pressure of the exhaust line 116 downstream of the valve 108. For example with the valve 108 closed, the pump may be run at full speed and the pressure within the exhaust line 116 may be measured with the second pressure sensor 110. Next, at 214, the lowest idle speed sufficient to maintain the baseline pump idle pressure may be determined. For example, the pump speed may be decreased to reach a baseline pump idle speed, defined as the lowest pump speed sufficient to maintain the baseline pump idle pressure. The baseline pump idle speed of the vacuum pump 112 provides the lowest energy consumption from running the vacuum pump 112 while maintaining the baseline pump idle pressure in the exhaust line 116 downstream of the valve 108.

Next at 220, the pump speed may be monitored while the vacuum pump is being operated at the baseline pump idle speed. For example, a pump speed monitor module may be included in the memory 122 and/or the memory of another controller, such as the pump controller 114 for monitoring pump speed. In some embodiments, as shown at 222, the valve 108 may be opened with no gas flowing in the process chamber 102 and the chamber pressure may be monitored via the pressure sensor 104. When the gate valve is opened in the gases flowing in the process chamber, the system should ideally remain sealed and the vacuum pump should be able to maintain a desired vacuum pressure within the process chamber 102.

Next at 230, it is determined whether the system can maintain vacuum (e.g., the baseline pump idle speed) in the process chamber 102 with the vacuum pump 112 running at the baseline pump idle speed. For example, a maintaining baseline pump idle pressure determiner module may be included in the memory 122 and/or the memory of another controller, such as the pump controller 114 for determining whether a pressure can be maintained while operating the pump 112 at the baseline pump idle speed. If it is determined that the system can maintain the vacuum pressure (e.g., the baseline pump idle speed) in the process chamber then the system can enter run mode, as shown at 232. For example, a system run module may be included in the memory 122 and/or the memory of another controller, to cause the system to enter a run mode, or for providing a signal indicating that a run mode may be entered, when the maintaining baseline pump idle pressure determiner module determines that the system can maintain the baseline pump idle pressure. However, if the system cannot maintain the vacuum pressure in the process chamber, then a system warning may be generated. For example, a system warning module may be included in the memory 122 and/or the memory of another controller, such as the pump controller 114 for causing the system to generate a warning when maintaining baseline pump idle pressure determiner module determines that the system cannot maintain the baseline pump idle pressure. The system warning may include one or more of warning messages, lights, audible sounds, or the like. Warnings may be displayed with a flashing yellow light and/or a message on the operator interface (e.g., human machine interface, or HMI) of the controller 106. Warning messages can provide further details on possible cause, such as pump degradation, leaks post or pre gate valve or in chamber. Warnings can be tied to the process tool controller and can prevent the next wafer load. For example, the controller 106 can display an appropriate warning message on the screen (e.g., leak, line clogging, pump wear out, or the like) and optionally can display a warning light, for example, on the sub fab equipment status light tower or other suitable location. The controller 106 may cause the alarm message, lights, audible sounds, etc., to be provided on the controller 106, on a process chamber controller display (not shown), a factory controller display (not shown), or any other suitable location. Customer programmable escalation options could include auto shut down or implementation of interlocks to prevent a next cycle of substrate processing if warnings are not acknowledged and/or if the deficiency is not resolved. If a system warning is generated, the system may be shut down and any leaks along the exhaust conduit 116 between the valve 108 and the process chamber 102 may be located and fixed.

Figure 3:
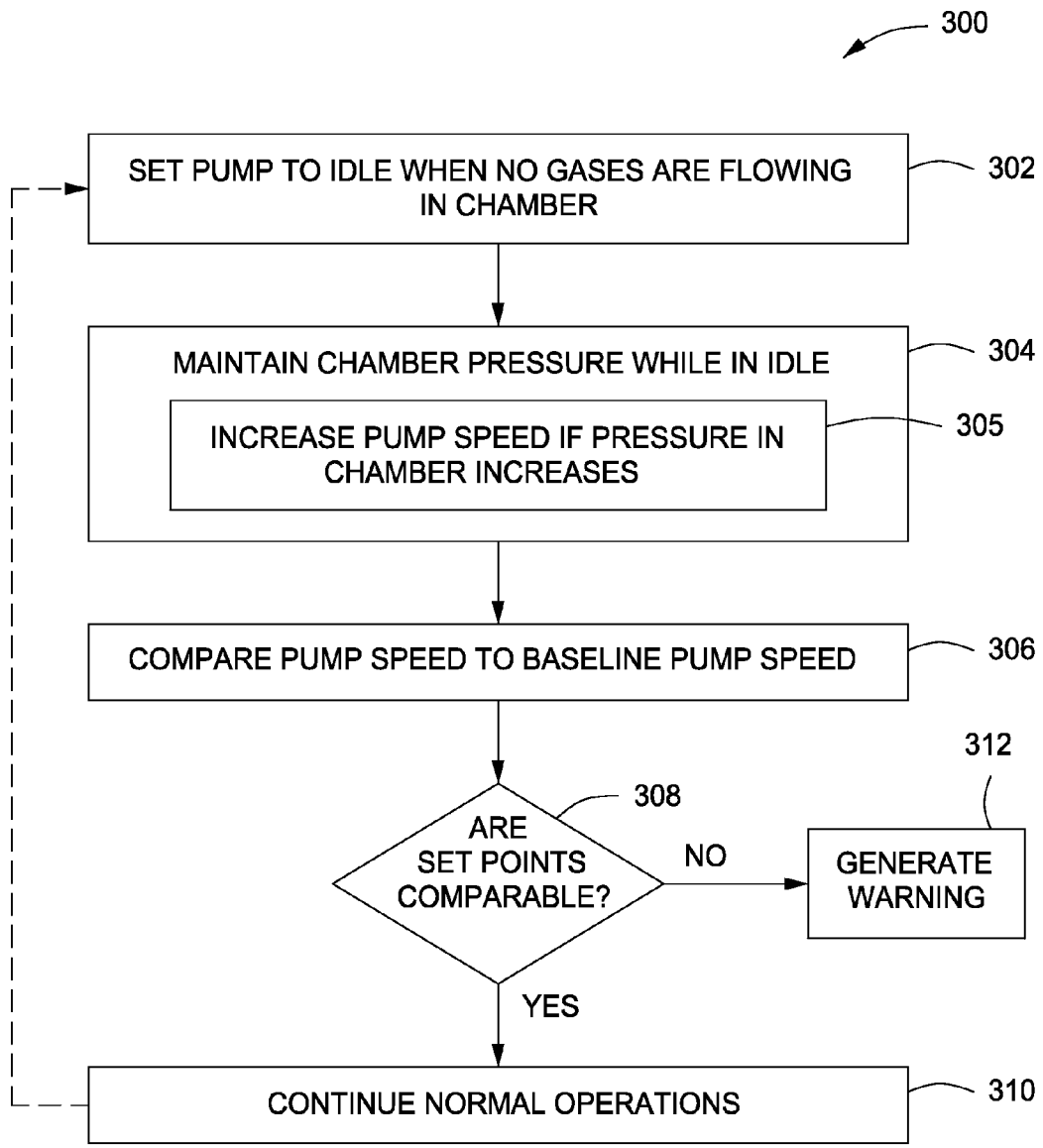
FIG. 3 depicts a flow chart of a method 300 for controlling a processing system in accordance with some embodiments of the present invention.

FIG. 3 depicts a flow chart of a method 300 for controlling a process chamber in accordance with some embodiments of the present invention. In some embodiments, the method 300 may be an example of a module of the memory 122 of the controller and may be used to control the processing system as described herein. In some embodiments, the method 300 may be performed after the method 200 has previously been performed. The method 300 generally begins at 302, where the vacuum pump 112 may be set to idle mode when no gases are flowing in the process chamber 102. For example, a vacuum pump idler module may be included in the memory 122 and/or the memory of another controller, such as the pump controller 114 for causing the vacuum pump to idle. For example, after processing of a substrate, or a number of substrates is completed, the process chamber may enter an idle mode to await further substrates, perform maintenance, or the like. When the process chamber is in an idle state, or at some other desired period of time when no gases are flowing in the process chamber, the speed of the vacuum pump 112 may be reduced. When the vacuum pump is at the reduced speed (e.g., baseline pump idle speed), the desired vacuum pressure (e.g., baseline pump idle pressure) in the process chamber 102 may typically be maintained, as no gases a flowing into the process chamber.

At 304, the pressure within the process chamber 102 may be maintained. For example, a pressure maintainer module may be included in the memory 122 and/or the memory of another controller, such as the pump controller 114 for causing the vacuum pressure to be maintained in the process chamber. The vacuum pump 112 can typically remain in idle (e.g., running at a first pump idle speed equal to the baseline pump idle speed, or some other idle speed less than a predetermined maximum pump idle speed) while the pressure within the process chamber 102 is maintained. However, as shown at 305, in order to maintain the desired pressure within the process chamber 102, the first pump idle speed of the vacuum pump 112 must be increased to a second pump idle speed to maintain the desired pressure (e.g., baseline pump idle pressure). For example, if the controller 106 detects from the data provided by the first pressure sensor 104 that the pressure in the process chamber is increasing above a desired setpoint (e.g., baseline pump idle pressure), the controller 106 may send a signal to the pump controller 114 to increase the speed of the vacuum pump 112 in order to maintain the pressure in the process chamber at or near the desired setpoint (e.g., baseline pump idle pressure). The pressure in the process chamber 102 may increase while in idle, for example, due to a leak along the exhaust line, deterioration of the pump, or the like.

At 306, the second pump idle speed may be compared to the first pump idle speed. For example, an idle speed comparer module may be included in the memory 122 and/or the memory of another controller, such as the pump controller 114 for comparing a pump idle speed with a baseline pump idle speed. In some embodiments, the second pump idle speed may be the current pump speed and the first pump idle speed may be the baseline pump idle speed. For example, the controller 106 may compare the second pump idle speed required to maintain the desired pressure (e.g., baseline pump idle pressure) in the process chamber 102 to the first pump idle speed.

At 308, it is determined whether the second pump idle speed is comparable to the first pump idle speed. If the second pump idle speed is within a predetermined range or tolerance of the first pump idle speed, the second pump idle speed setpoint may be considered to be comparable to the first pump idle speed and the chamber may continue normal operation, as shown at 310. However, if the second pump idle speed is outside of a predetermined range or tolerance of the first pump idle speed, or the second pump idle speed exceeds some predetermined maximum pump idle speed, a warning may be generated, as shown at 312. The warning may be any of the warnings as described above and may be the same warning (or combination of warnings) or may be different warnings in whole or in part. Thus, if the system can maintain the desired pressure (e.g., baseline pump idle pressure) in the process chamber with the vacuum pump 112 running at or below a predetermined maximum pump idle speed, the chamber may continue normal operations. Otherwise a warning may be generated.

Figure 4:
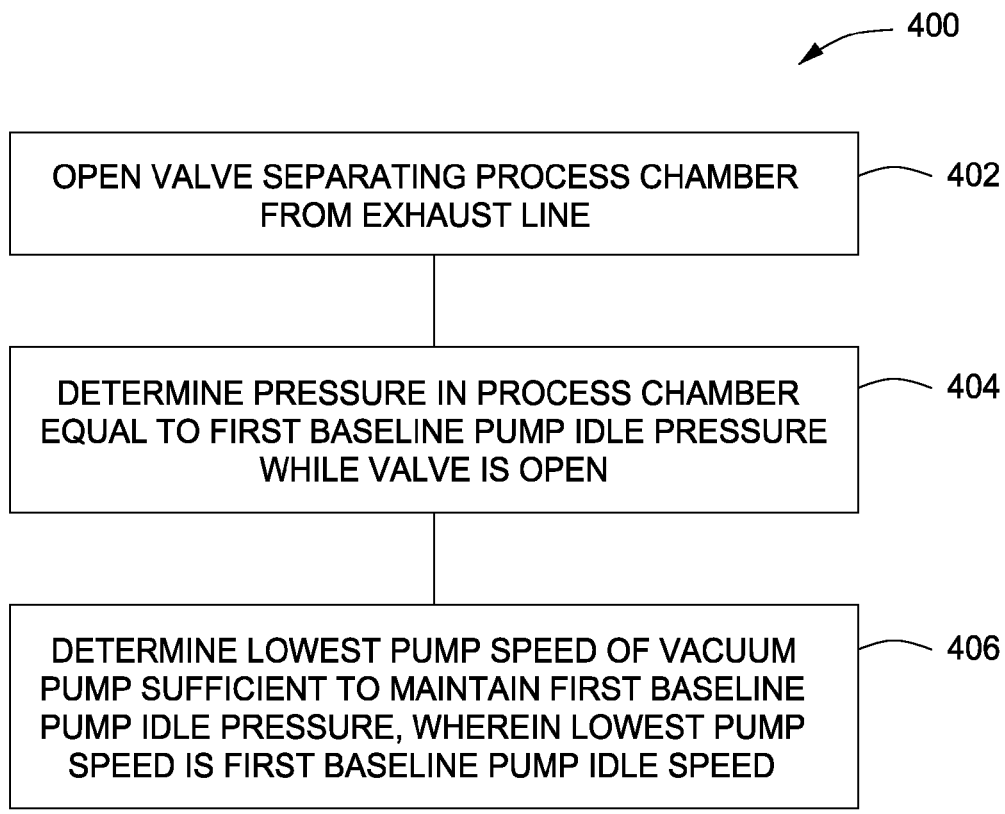
FIG. 4 depicts a flow chart of a method 400 for determining a first baseline pump idle speed in accordance with some embodiments of the present invention.

In some embodiments, one or more baseline pump idle speeds may be determined and utilized in the methods described above and further in the methods discussed below. For example, FIG. 4 depicts a method 400 for determining a baseline pump idle speed of a vacuum pump in accordance with some embodiments of the present invention. In some embodiments, the method 400 may be an example of a module of the memory 122 of the controller and may be used to control the processing system as described herein. The method 400 is described below in accordance with the embodiments of the system 100 as shown in FIG. 1; however, any suitable processing system may be utilized.

The method 400 may be utilized to determine a first baseline pump idle speed of the vacuum pump 112, where the first baseline pump idle speed may be selected to maintain the process chamber 102 at a first baseline pump idle pressure. For example, the first baseline pump idle pressure may be a pressure of the interior volume 103 of the process chamber 102 and the exhaust line 116. The first baseline pump idle pressure may be maintained in the system 100 during an idle mode when no gases are flowing and when the valve 108 is open. The method 400 may be performed at startup of the system 100, after servicing, periodically, or at any desired time when the system 100 is not in a run mode. For example, a first baseline pump idle speed determiner module may be included in the memory 122 and/or the memory of another controller, such as the pump controller 114 for determining the first baseline pump idle speed.

The method 400 begins at 402 by opening the valve 108 separating the process chamber 102 from the exhaust line 116. The valve 108 may be opened to the maximum setting or to any suitable setting that is used during an idle mode of the system 100.

At 402, a pressure in the process chamber 102 equal to the first baseline pump idle pressure is determined while the valve 108 is open. For example, the first baseline pump idle pressure may be measured by the first pressure sensor 104, the second pressure sensor 110, or a combination thereof. The initial pump speed of the vacuum pump 112 used to determine the first baseline pump idle pressure may be one or more of the maximum pump speed of the vacuum pump 112 or a maximum pump speed of the vacuum pump 112 that will be used during an idle mode of the system 100. The initial pump speed may be used to determine the first baseline pump idle pressure. In some embodiments, the first baseline pump idle pressure may be the lowest achievable pressure that may be obtained in the process chamber 102 and the exhaust line 116 while the valve 108 is open.

At 406, a lowest pump speed of the vacuum pump 112 sufficient to maintain the first baseline pump idle pressure may be determined. The lowest pump speed may be the first baseline pump idle speed. In operation, once the first baseline pump idle pressure is determined, the first baseline pump idle speed may be determined by reducing the pump speed until the pump speed is no longer sufficient to maintain the first baseline pump idle pressure.

Figure 5:
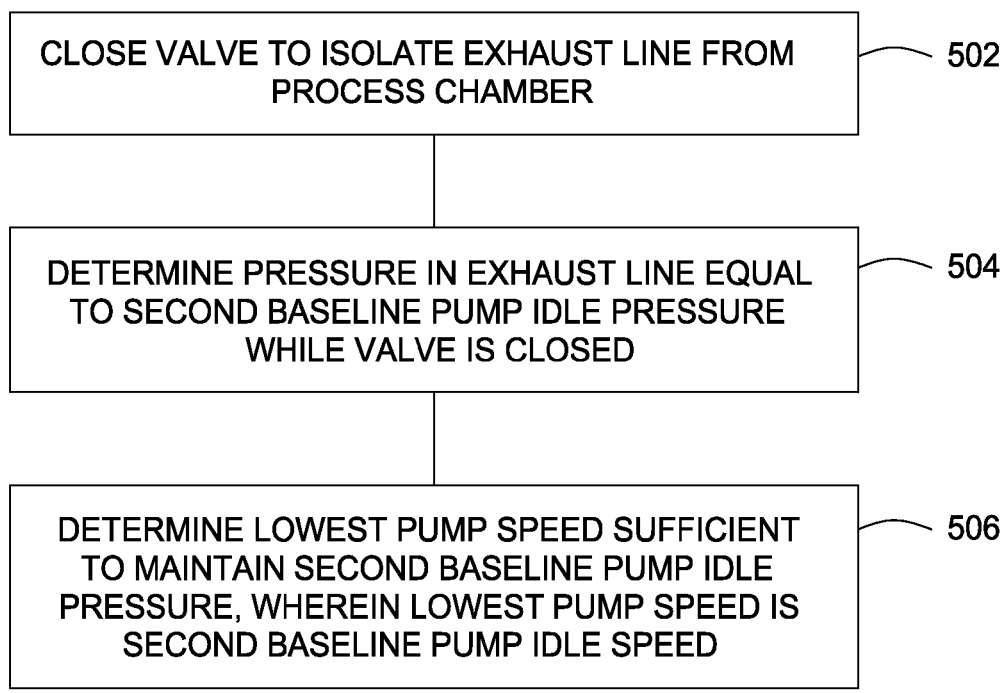
FIG. 5 depicts a flow chart of a method 500 for determining a second baseline pump idle speed in accordance with some embodiments of the present invention.

FIG. 5 depicts a method 500 for determining a baseline pump idle speed of a vacuum pump in accordance with some embodiments of the present invention. In some embodiments, the method 500 may be an example of a module of the memory 122 of the controller and may be used to control the processing system as described herein. The method 500 is described below in accordance with the embodiments of the system 100 as shown in FIG. 1; however, any suitable processing system may be utilized. The method 500 may be performed at startup of the system 100, after servicing, periodically, or at any desired time when the system 100 is not in a production mode. The method 500 may be substantially similar to step 210 of the method 200 as discussed above for determining a baseline pump idle pressure. For example, a second baseline pump idle speed determiner module may be included in the memory 122 and/or the memory of another controller, such as the pump controller 114 for determining the second baseline pump idle speed.

The method 500 begins at 502 by closing the valve 108 to isolate the exhaust line 116 from the process chamber 102. Accordingly, the baseline pump idle pressure determined by method 500 may be a baseline pump idle pressure of the exhaust line 116.

At 502, a pressure of the exhaust line 116 equal to a second baseline pump idle pressure may be determined while the valve 108 is closed. For example, the first baseline pump idle pressure may be measured by the second pressure sensor 110. The initial pump speed of the vacuum pump 112 used to determine the second baseline pump idle pressure may be one or more of the maximum pump speed of the vacuum pump 112 or a maximum pump speed of the vacuum pump 112 that will be used during an idle mode of the system 100. The initial pump speed may be used to determine the second baseline pump idle pressure. In some embodiments, the second baseline pump idle pressure may be the lowest achievable pressure that may be obtained in the exhaust line 116 while the valve 108 is closed.

At 506, a lowest pump speed of the vacuum pump 112 sufficient to maintain the second baseline pump idle pressure may be determined. The lowest pump speed may be the second baseline pump idle speed. In operation, once the second baseline pump idle pressure is determined, the second baseline idle speed may be determined by reducing the pump speed until the pump speed is no longer sufficient to maintain the second baseline pump idle pressure in the exhaust line 116.

Figure 6:
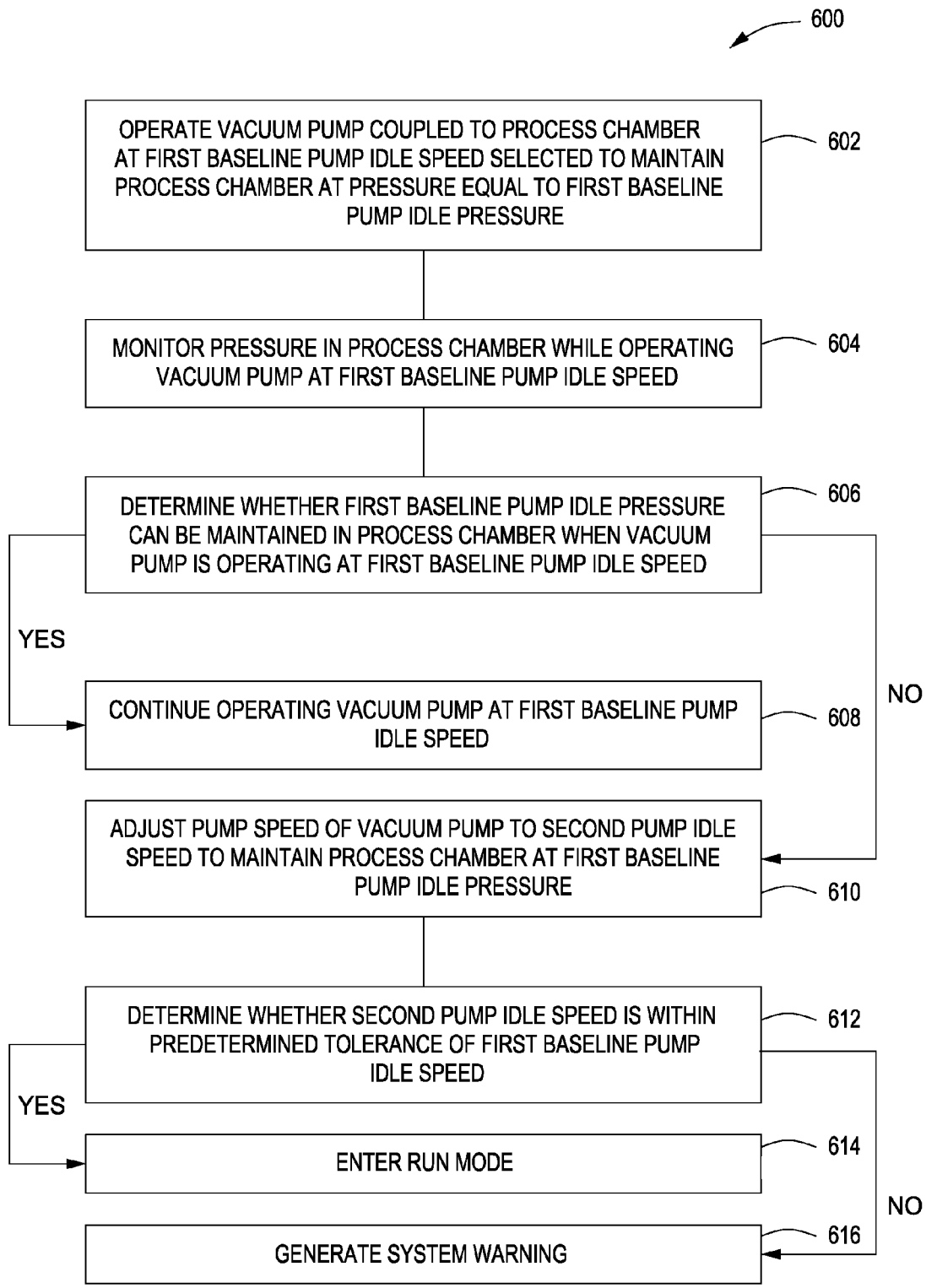
FIG. 6 depicts a flow chart of a method 600 for controlling a processing system in accordance with some embodiments of the present invention.

FIG. 6 depicts a flow chart of a method 600 for controlling a processing system in accordance with some embodiments of the present invention. In some embodiments, the method 600 may be an example of a module of the memory 122 of the controller and may be used to control the processing system as described herein. The method 600 may be substantially similar to the combination of steps 220-234 of method 200 and method 300 as discussed above. Further the method 600 may be utilized after determining the one or more baseline pump idle pressures at methods 400, 500 and/or step 210 of method 200.

The method 600 may begin at 602 by operating the vacuum pump 112 at the first baseline pump idle speed selected to maintain the process chamber 102 at a pressure equal to the first baseline pump idle pressure. As discussed above, the first baseline pump idle pressure and first baseline pump idle speed may be determined using method 400. During operation at 602, the valve 108 may be open. Further, during operation at 602, the system 100 may be operating in an idle mode where the vacuum pump is idling and no gases are flowing in the process chamber 102. For example, vacuum pump operator module may be included in the memory 122 and/or the memory of another controller, such as the pump controller 114 for operating the vacuum pump at a desired pump speed.

At 604, the pressure in the process chamber may be monitored while operating the vacuum pump at the first baseline pump idle speed. For example, the pressure may be monitored by the first pressure sensor 104, the second pressure sensor 110, or a combination thereof. The monitoring of the process chamber may occur while the system 100 is operating in an idle mode, where the vacuum pump 112 is idling and no gases are flowing in the chamber 102, such from the one or more gas sources 124. For example, a pressure monitor module may be included in the memory 122 and/or the memory of another controller, such as the pump controller 114 for monitoring the pressure while the vacuum pump is operated at a desired pump speed.

At 606, a determination may be made as to whether the first baseline pump idle pressure can be maintained in the process chamber 102 while the vacuum pump 112 is operating at the first baseline pump idle speed. For example, the determination at 606 may be made by monitoring the pressure in the process chamber 102 using one or more of the first and second pressure sensors 104, 110 for a deviation from the first baseline pump idle pressure. The deviation may be predetermined, such as percentage deviation from the first baseline pump idle pressure, or may be determined by measurements during operation, such as a standard deviation from a mean value of pressure measurements while the system 100 operating in an idle mode. For example, a first baseline pump idle pressure determiner module may be included in the memory 122 and/or the memory of another controller, such as the pump controller 114 for determining whether the first baseline pump idle pressure can be maintained in the process chamber.

At 608, upon monitoring that no deviation in the first baseline pump idle pressure exists, the vacuum pump 112 may continue to operate at the first baseline pump idle speed.

Alternatively, at 610, upon monitoring that a deviation exists, such as a pressure in the process chamber that is different from the first baseline pump idle pressure, the pump speed of the vacuum pump 112 may be adjusted to a second pump idle speed to maintain the process chamber 102 at the first baseline pump idle pressure. The second pump idle speed may be determined automatically, for example, by a feedback loop between one or more of the first and second pressure sensors 104, 110 and the pump controller 114 of the vacuum pump 112 upon receiving a signal from the controller 106 when a deviation from the first baseline pump idle pressure has been determined. For example, a first baseline pump idle speed adjuster module may be included in the memory 122 and/or the memory of another controller, such as the pump controller 114 for adjusting the pump idle speed in response to a negative output from the first baseline pump idle pressure determiner module.

At 612, a determination may be made whether the second pump idle speed is within a predetermined tolerance of the first baseline pump idle speed. For example within a predetermined tolerance may include within the maximum pump speed of the vacuum pump 112 that will be used during an idle mode of the system 100, within a predetermined range of the first baseline pump idle speed, or other suitable tolerances of the first baseline pump idle speed. For example, second pump idle speed tolerance determiner module may be included in the memory 122 and/or the memory of another controller, such as the pump controller 114 for determining whether the second pump idle speed is within a predetermined tolerance of the first baseline pump idle speed.

At 614, upon determining that the second pump idle speed is within the predetermined tolerance of the first baseline pump idle speed, the processing system 100 may enter a run mode, such as a production mode or the like. Alternatively, upon determining that the second pump idle speed is within the predetermined tolerance, the system 100 may continue to operate in an idle mode where the vacuum pump 112 may continue to operate at the second baseline pump idle speed. For example, a system run module may be included in the memory 122, and/or the memory of another controller of the system, to cause or allow the system to operate in a run mode or idle mode in response to a positive output from second pump idle speed tolerance determiner module.

At 616, upon determining that the second pump idle speed is not within a predetermined tolerance of the first baseline pump idle speed, a system warning may be generated. The system warning may be any suitable system warning as discussed herein. For example, a system warning module may be included in the memory 122 and/or the memory of another controller, such as the pump controller 114 for issuing a system warning in response to a negative output from second pump idle speed tolerance determiner module.

In some embodiments, when a system warning is generated, a diagnostic routine may be run to determine the cause of the system warning. For example, the system may be run in a diagnostic mode where no gases are flowing into the process chamber 102 from the one or more gas sources 124. Further, the relationship between the second pump idle speed and the second pump idle pressure (as determined by method 500 or step 210 of method 200) may be utilized to at least narrow the cause of the system warning to a region of the system 100 as discussed below.

The diagnostic mode may include narrowing the source of the system warning to above or below the valve 108 using the relationship between the second pump idle speed and the second pump idle pressure. For example, the diagnostic mode may begin by closing the valve 108 upon determining that the second pump speed is not within the predetermined tolerance of the first baseline pump idle speed. Next, the vacuum pump 112 may be operated at the second baseline pump idle speed which has been selected to maintain the exhaust line 116 at the second baseline pump idle pressure. The pressure of the exhaust line 116 may be monitored by the second pressure sensor 110 while the vacuum pump 112 is operating at the second baseline pump idle speed. A determination may be made whether the second baseline pump idle pressure can be maintained in the exhaust line 116 when the vacuum pump is operating at the second baseline pump idle speed.

For example, if the pressure of exhaust line 116 remains at the second baseline pump idle pressure while the vacuum pump 112 is operated at the second baseline pump idle speed, it may be determined that the cause of the system warning at 616 may be a component of the system 100 above the valve 108, such as a leak in the chamber 102 or the like.

Alternatively, upon monitoring a pressure in the exhaust line 116 that is different from the second baseline pump idle pressure, the pump speed of the vacuum pump 112 may be adjusted to a third pump idle speed to maintain the exhaust line 116 at the second baseline pump idle pressure. A determination may be made whether the third pump idle speed is within a predetermined tolerance of the second baseline pump idle speed. The predetermined tolerance may be determined in a similar way to that discussed above at 612. If the third pump idle speed is within the predetermined tolerance of the second baseline pump idle speed, it may be determined that the cause of the system warning at 616 may be a component of the system 100 above the valve 108.

If the third pump idle speed is not within the predetermined tolerance of the second baseline pump idle speed, it may be determined that the cause of the system warning at 616 may be a component of the system 100 below the valve 108, such as a leak in the exhaust line 116 or the like.

Thus, embodiments of the monitoring and control system in accordance with the present invention may provide improved methods of maintaining chamber operating pressure. Additionally, embodiments of the present invention may provide a variety of warnings of impending down time unless preventative maintenance is performed.

Embodiments of the present invention can assure proper chamber operating pressure and additionally can predict need for a down time preventative maintenance check by using an integrated controls solution as described above, chamber and exhaust line pressure readings, the ability to dynamically adjust the vacuum pump idle speed, and the ability to control the position of the valve 108. In some embodiments, during the controller 106 auto checking procedure for leaks, line clogging, or pump wear out, throttle valve or gate valve position could optionally be managed by the controller 106 to better differentiate between line clogging and pump wear out root causes.

The following non-limiting examples illustratively depict methods of controlling a process chamber in accordance with some embodiments of the present invention. In some embodiments, the methods of controlling a process chamber as discussed above may be utilized for predictive leak detection. This example is not intended to be the only way to predict a leak using the methods described herein.

Periodically, during non-process chamber recipe cycle time, the controller 106 could perform this test. When the valve 108 is near closed, the pump RPM may be reduced, and a nitrogen purge of the vacuum pump 112 may be set to a fixed flow rate. The pressure at the pump inlet will fall over time and can be compared to an original baseline pressure decay curve. Next, the vacuum pump pressure decay curve over time and variance in the pump pressure decay curve over time may be compared to the baseline pressure decay curve over time and variance in the baseline pressure decay curve over time. Each facilitation, throttle valve, and pump install will produce a unique pressure decay vs. time curve. The baseline curve would need to be determined when equipment or plumbing is reconfigured. Small, medium, and large leaks could be simulated at the time of the base lining via use of a sample port at the gate valve. A statistical analysis can be used to determine the confidence level that will be chosen to send a preventative maintenance warning and provide support data in a pre formatted report.

In some embodiments, the methods of controlling a process chamber as discussed above may be utilized for predictive clog detection. This example is not intended to the only way to track line clogging. Periodically, preferably during non-process chamber recipe cycle time, the controller 106 could perform this test.

When the valve 108 is nearly closed and the chamber pressure rises, with the vacuum pump 112 at high RPM output, the valve 108 may be quickly opened. The pressure rise vs. time curve at the pump and the pressure fall curve vs. time at the chamber may be observed and/or recorded. Comparing the original configuration pump pressure rise over time curve and chamber pressure fall vs. time curve to the post preventative maintenance pressure rise and fall curves will provide data characteristic to the change in Cv value of the exhaust line conductance. The change in Cv value and change in variation in the two key pressure vs. time curves will be indicative of the degree of exhaust line lumen occlusion. Each system can be unique and baseline performance must be characterized for the initial assembly and after pressure transducers, pumps, throttle valves, or chambers have been changed.

In some embodiments, the methods of controlling a process chamber as discussed above may be utilized for pump wear out detection. This example is not intended to the only way to track pump wear out. This issue is very important as new factories use new pumps that are very durable, and subsequently, rebuilt pumps are used until they are so worn out that they are no longer meet minimum reliability threshold specifications.

In some embodiments, with the valve 108 at a preset position, and the pump at maximum or specific high RPM and power output, a significant amount of a low viscosity gas (such as hydrogen or helium) may be flowed into a process chamber 102. The pump and chamber pressure vs. time may be compared and variation in these curves may be compared to a baseline pump curve capability. As pumps wear, they lose pumping capacity for low viscosity gases in the later compression stages of the pump. This reduced pumping efficiency results a reduction in the pumps ability to maintain a low chamber pressure. Additionally a pump with wear out characteristics experience excess heating of the last few pump compression stages and higher chamber pressures at any given pump RPM. A pump exhibiting wear out characteristics requires more power to maintain the same chamber pressure. In addition to measuring a increase in chamber pressure, the controller 106 can compare final stage pump temperatures and pump energy requirements for initial commissioning, and monitor pump curves and operational parameters over time. As the pump wears, the system could periodically conduct a pump curve test to determine pump capability. With a statistical evaluation of pump wear out (pump curve and final stage pump temp) over time (with each unique facilitation) the controller 106 can provide a warning that the pump capability is approaching the need for rebuild or change out prior to yield loss and/or significant power waste due to premature pump wear out.

In addition to warnings, the controller 106 can produce standard reports including statistical analysis, change in process capability, and/or confidence level of failure or risk of not performing the recommended preventative maintenance activities.

While the foregoing is directed to embodiments of the present invention, other and further embodiments of the invention may be devised without departing from the basic scope thereof.

The invention claimed is:

1. A method of controlling a processing system, comprising:
    determining a first baseline pump idle pressure in a process chamber while a valve separating the process chamber from an exhaust line coupled to a vacuum pump is open;
    determining a first baseline pump idle speed, wherein the first baseline pump idle speed is equal to a lowest pump speed of the vacuum pump sufficient to maintain the first baseline pump idle pressure;
    operating a vacuum pump coupled to a process chamber at a first baseline pump idle speed selected to maintain the process chamber at a pressure equal to a first baseline pump idle pressure;

monitoring the pressure in the process chamber while operating the vacuum pump at the first baseline pump idle speed;

upon monitoring a pressure in the process chamber that is different from the first baseline pump idle pressure, adjusting the pump speed of the vacuum pump to a second baseline pump idle speed to maintain the process chamber at the first baseline pump idle pressure, wherein the second baseline pump idle speed of the vacuum pump maintains the exhaust line between the valve and the vacuum pump at a pressure equal to a second baseline pump idle pressure when the valve separating the process chamber and the exhaust line is closed; and determining whether the second pump idle speed is within a predetermined tolerance of the first baseline pump idle speed.

2. The method of claim 1, wherein operating the vacuum pump further comprises operating the vacuum pump at the first baseline pump idle speed when no gases are flowing in the process chamber.

3. The method of claim 1, further comprising:

upon determining that the second pump idle speed is within a predetermined tolerance of the first baseline pump idle speed, causing or allowing the processing system to enter a run mode or generating a signal indicating that the processing system can enter the run mode.

4. The method of claim 1, wherein determining the second baseline pump idle speed further comprises:

determining the second baseline pump idle pressure in the exhaust line while the valve is closed to isolate the exhaust line from the process chamber; and determining the second baseline pump idle speed, wherein the second baseline pump idle speed is equal to a lowest pump speed sufficient to maintain the second baseline pump idle pressure.

5. The method of claim 1, further comprising:

upon determining that the second pump idle speed is not within a predetermined tolerance of the first baseline pump idle speed, generating a system warning.

6. The method of claim 5, further comprising:

closing the valve upon determining that the second pump speed is not within a predetermined tolerance of the first baseline pump idle speed;

operating the vacuum pump at the second baseline pump idle speed selected to maintain the exhaust line at the second baseline pump idle pressure;

monitoring the pressure within the exhaust line with the valve closed while no gas is flowing into the process chamber; and determining whether the second baseline pump idle pressure can be maintained in the exhaust line when the vacuum pump is operating at the second baseline pump idle speed.

7. The method of claim 6, further comprising:

upon monitoring a pressure in the exhaust line that is different from the second baseline pump idle pressure, adjusting the pump speed of the vacuum pump to a third pump idle speed to maintain the exhaust line at the second baseline pump idle pressure; and determining whether the third pump idle speed is within a predetermined tolerance of the second baseline pump idle speed.

8. A non-transitory computer readable medium having a program stored thereon that, when executed by a controller, cause a method of controlling a processing system to be performed, the method comprising:

determining a first baseline pump idle pressure in a process chamber while a valve separating the process chamber from an exhaust line coupled to a vacuum pump is open;

determining a first baseline pump idle speed, wherein the first baseline pump idle speed is equal to a lowest pump speed of the vacuum pump sufficient to maintain the first baseline pump idle pressure;

operating a vacuum pump coupled to a process chamber at a first baseline pump idle speed selected to maintain the process chamber at a pressure equal to a first baseline pump idle;

monitoring the pressure in the process chamber while operating the vacuum pump at the first baseline pump idle speed;

upon monitoring a pressure in the process chamber that is different from the first baseline pump idle pressure, adjusting the pump speed of the vacuum pump to a second baseline pump idle speed to maintain the process chamber at the first baseline pump idle pressure, wherein the second baseline pump idle speed of the vacuum pump maintains the exhaust line between the valve and the vacuum pump at a pressure equal to a second baseline pump idle pressure when the valve separating the process chamber and the exhaust line is closed; and determining whether the second pump idle speed is within a predetermined tolerance of the first baseline pump idle speed.

9. The non-transitory computer readable medium of claim 8, further comprising:

upon determining that the second pump idle speed is within a predetermined tolerance of the first baseline pump idle speed, causing or allowing the processing system to enter a run mode or generating a signal indicating that the processing system can enter the run mode.

10. The non-transitory computer readable medium of claim 8, wherein operating the vacuum pump further comprises operating the vacuum pump at the first baseline pump idle speed when no gases are flowing in the process chamber.

11. The non-transitory computer readable medium of claim 8, further comprising:

upon determining that the second pump idle speed is not within a predetermined tolerance of the first baseline pump idle speed, generating a system warning.

12. A processing system, comprising:

a controller having one or more inputs to receive respective input values corresponding to a pressure in an interior volume of a process chamber and a pump speed of a vacuum pump coupled to the process chamber, wherein the controller is programmed to:

receive the respective input values while the process chamber is in an idle mode; determine whether the process chamber can be maintained at a predetermined first baseline pump idle pressure corresponding to the vacuum pump operating at or within a predetermined tolerance of a first baseline pump idle speed, wherein the first baseline pump idle speed of the vacuum pump is determined by opening a valve separating the process chamber from an exhaust line coupled to the vacuum pump and determining a lowest pump speed of the vacuum pump sufficient to maintain the predetermined first baseline pump idle pressure;

upon determining that the process chamber cannot be maintained at the predetermined first baseline pump idle pressure corresponding to the vacuum pump operating at or within the predetermined tolerance of the first baseline pump idle speed, adjust the pump speed of the vacuum pump to a second baseline pump idle speed to maintain the process chamber at the first baseline pump idle pressure, wherein the second baseline pump idle speed of the vacuum pump maintains the exhaust line between the valve and the vacuum pump at a pressure equal to a second baseline pump idle pressure when the valve separating the process chamber and the exhaust line is closed; and determine whether the second pump idle speed is within a predetermined tolerance of the first baseline pump idle speed.

13. The processing system of claim 12, wherein the controller is further programmed to, upon determining that the process chamber can be maintained at the predetermined first baseline pump idle pressure corresponding to the vacuum pump operating at or within the predetermined tolerance of the first baseline pump idle speed, causing or allowing the processing system to enter a run mode or generating a signal indicating that the processing system can enter the run mode.

14. The processing system of claim 12, wherein the controller is further programmed to, upon determining that the process chamber cannot be maintained at the predetermined first baseline pump idle pressure corresponding to the vacuum pump operating at or within the predetermined tolerance of the first baseline pump idle speed, generating a system warning.

15. The processing system of claim 14, wherein the controller is further programmed to receive an input value corresponding to a pressure in an exhaust line disposed between the process chamber and the vacuum pump and to determine whether the exhaust line can be maintained at the predetermined second baseline pump idle pressure corresponding to the vacuum pump operating at or within a predetermined tolerance of a second baseline pump idle speed.

16. The processing system of claim 15, further comprising:
the process chamber having an interior processing volume and the exhaust line coupled to the interior processing volume;
a gas source coupled to the interior processing volume to provide one or more gases to the process chamber;
a valve disposed in the exhaust line;
the vacuum pump coupled to the exhaust line downstream of the valve such that the vacuum pump may be selectively coupled to or isolated from the processing volume via operation of the valve;
a first pressure sensor to provide a first input value of the respective input values corresponding to the pressure within the interior processing volume; and
a second pressure sensor to provide a second input value of the respective input values corresponding to the pressure within the exhaust line between the valve and the vacuum pump.

* * * * *